(12) United States Patent
Chu

(10) Patent No.: US 6,803,307 B1
(45) Date of Patent: Oct. 12, 2004

(54) METHOD OF AVOIDING ENLARGEMENT OF TOP CRITICAL DIMENSION IN CONTACT HOLES USING SPACERS

(75) Inventor: Pei-Hung Chu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/609,039

(22) Filed: Jun. 27, 2003

(51) Int. Cl.[7] .......................................... H01L 21/4763
(52) U.S. Cl. ...................... 438/637; 438/672; 438/700
(58) Field of Search ................................ 438/637–639, 438/672–675, 700

(56) References Cited

U.S. PATENT DOCUMENTS 5,496,765 A * 3/1996 Schwalke .................... 438/404
6,096,594 A * 8/2000 Lin et al. ..................... 438/238
2002/0110992 A1 * 8/2002 Ho ............................... 438/389

* cited by examiner

*Primary Examiner*—Dung A. Le
(74) *Attorney, Agent, or Firm*—Stout, Uxa, Buyan & Mullins, LLP

(57) ABSTRACT

A method for manufacturing contact holes with spacers between a substrate and an interconnect layer or between two interconnect layers is disclosed. The method produces contact holes with a relatively uniform CD from top to bottom, i.e. without a rounded top, thereby increasing the reliability of the contact hole. A dielectric layer, antireflective layer and patterned photoresist layer are deposited in sequence over a substrate or bottom interconnect layer. Contact holes are etched into the antireflective layer and the dielectric layer exposing a surface of the substrate or bottom interconnect layer. A spacer material is deposited onto the antireflective layer and into the contact holes. The spacer material is then anisotropically etched from the antireflective layer, leaving the spacer material in the contact holes. The etching process preferably removes the spacer material at a faster rate than the antireflective coating layer.

35 Claims, 5 Drawing Sheets

METHOD OF AVOIDING ENLARGEMENT OF TOP CRITICAL DIMENSION IN CONTACT HOLES USING SPACERS

BACKGROUND OF THE INVENTION

1. Field of the Invention

The present application relates to methods of fabricating integrated circuit devices and, more particularly, to methods of fabricating contact holes with spacers having an improved top critical dimension.

2. Description of Related Art

An important capability for manufacturing reliable integrated circuits is to precisely shape the individual structures that form the integrated circuits. One such structure is a contact hole. Conducting material may be deposited into a formed contact hole to provide a vertical electrical pathway between horizontal layers within an integrated circuit. Integrated circuits may comprise multiple layers, and contact holes are implemented between each layer to allow electrical communication between neighboring layers. Conventional integrated circuits may require millions of contact holes with a precise uniform diameter or critical dimension (CD).

The prior art can have problems creating a contact hole having a uniform CD from top to bottom. Typical prior art methods for manufacturing a contact hole tend to produce a contact hole that increases in diameter near the top of the contact hole. This increase in the CD near the top of the contact hole can diminish the reliability of the integrated circuit.

A prior art manufacturing process for creating a contact hole with a spacer is elucidated in FIG. 1a, wherein a substrate 100 is depicted covered by a first dielectric layer 102. The substrate 100 may comprise a silicon wafer and the first dielectric layer 102 may comprise a deposited silicon dioxide layer. The first dielectric layer 102 may be used, as is known in the art, as an interlayer dielectric (ILD) layer. A patterned photoresist layer 104 having an opening 104a may be formed on the first dielectric layer 102 using conventional techniques.

FIG. 1b illustrates a portion of the integrated circuit illustrated in FIG. 1a after the first dielectric layer 102 has been etched using the patterned photoresist 104 as a mask to form a contact hole 102a. A timed or controlled etching process may be implemented alone or in combination with an etchant that is selective toward the dielectric layer 102 in relation to the substrate 100, to thereby deter etching into the substrate 100 as the contact hole 102a exposes the upper surface of the substrate 100. In FIG. 1c, a conformal second dielectric layer 106 is formed on the first dielectric layer 102 and in the contact hole 102a. The conformal second dielectric layer 106 may be a deposited silicon oxide or tetraethylorthosilicate (TEOS) oxide layer. The conformal second dielectric layer may be deposited using either a physical or chemical vapor deposition process.

In FIG. 1d, the second dielectric layer 106 is anisotropically etched away to leave a spacer 106b on the sidewall of the contact hole 106a. The CD of the contact hole 106a depends in part on the uniformity of the thickness of the spacer 106b and shape of the first dielectric layer 102. However, the upper surface of the first dielectric layer 102 is typically over-etched during the anisotropic etching process used to form the spacer 106b in the contact hole 106a. The CD of the upper portion of the contact hole 106a is thus enlarged as a consequence of the upper edge of the contact hole 106a being substantially rounded. As a result of the nonuniform CD of the contact hole 106a, the reliability of the integrated circuit can be attenuated.

To continue to meet demands for increasing the reliability of integrated circuits, new methods are needed to overcome the limitations of current methods. Thus, there remains a need for methods of fabricating integrated circuit devices which reduces or eliminates the problems associated with conventional methods, including, for example, the problems associated with manufacturing contact holes having a uniform CD.

SUMMARY OF THE INVENTION

The present invention addresses these needs by providing methods of fabricating contact holes with spacers through interlayer dielectric layers wherein the CD of the contact holes remains relatively uniform from top to bottom. Specifically, an object of the invention is to provide manufacturing methods for contact holes with spacers that serve to prevent the CD of the upper portions of the contact holes from becoming substantially enlarged.

In accordance with the present invention, an exemplary method for making a contact hole with a spacer comprises a step of forming a first dielectric layer on a substrate, followed by a step of forming an etch stop, such as a dielectric antireflective coating layer, over the first dielectric layer. In a preferred embodiment, the first dielectric layer comprises silicon oxide and the substrate is a semiconductor wafer. The first dielectric layer may be deposited, as is known in the art, by physical or chemical vapor deposition. The antireflective coating layer, which can comprise, for example, SiON (silicon oxynitride), may then be formed over the first dielectric layer using a deposition process.

A photoresist layer may then be formed on the antireflective coating layer and patterned using known photolithographic techniques. Using the patterned photoresist layer as a template, an etching process may then be used to etch contact holes into the antireflection coating layer and the first dielectric layer. The contact holes are advantageously of sufficient depth to expose a surface of the underlying substrate. The etching process should have a relatively low selectivity toward the substrate to prevent dishing or excessive etching of the upper surface of the substrate. The photoresist may then be removed and the substrate cleaned.

A conformal second dielectric layer comprising a material, such as silicon oxide, may be formed over the antireflective coating layer and into the contact holes. The conformal second dielectric layer may be anisotropically etched, preferably with a process having a relatively low etching selectivity with the antireflective coating layer and with the substrate. The process removes the second dielectric layer over the antireflective coating layer while leaving the second dielectric layer on the wall of the contact holes, thereby forming spacers within the contact holes. Conductive material may now be deposited into the contact holes to provide a vertical electrical path between the substrate and an interconnect layer that will be created over the contact holes.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1A:
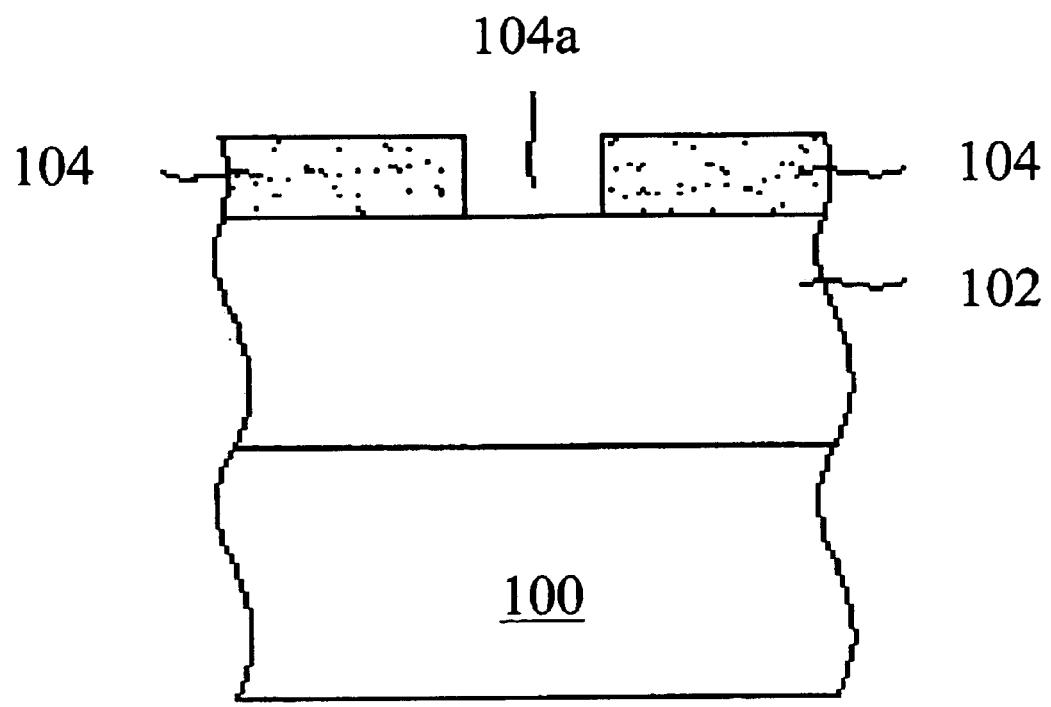
FIG. 1a is a cross-sectional view of a prior-art substrate having a dielectric layer and a patterned photoresist layer formed thereon.
Figure 1B:
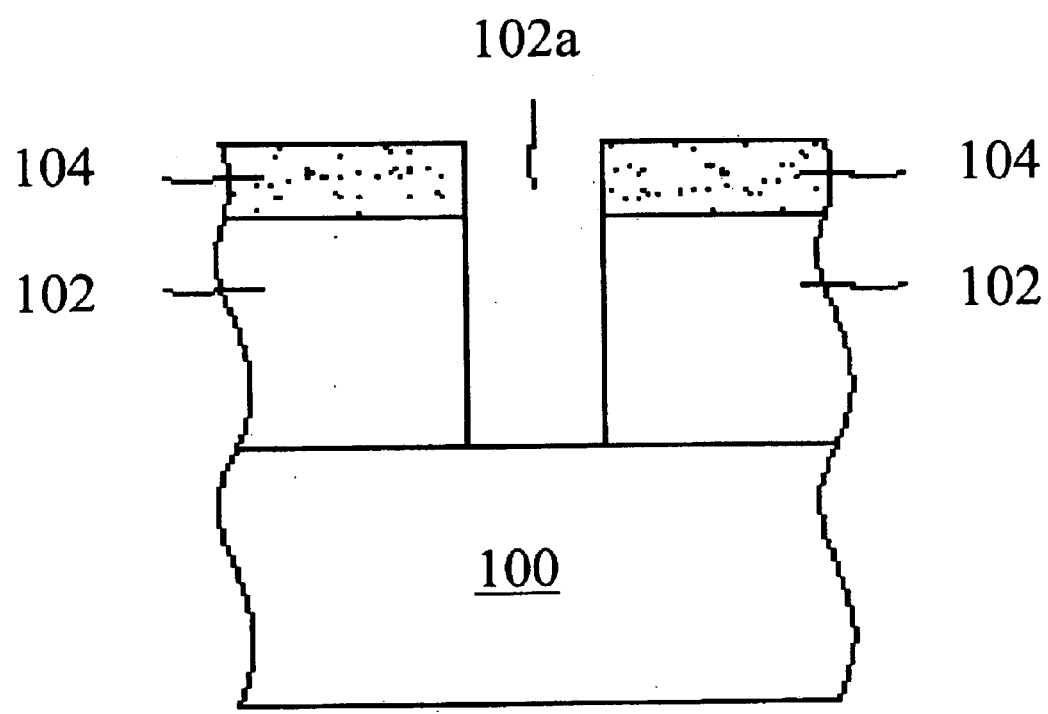
FIG. 1b is a cross-sectional view illustrating the structure of FIG. 1a after an etching process has formed a contact hole.
Figure 1C:
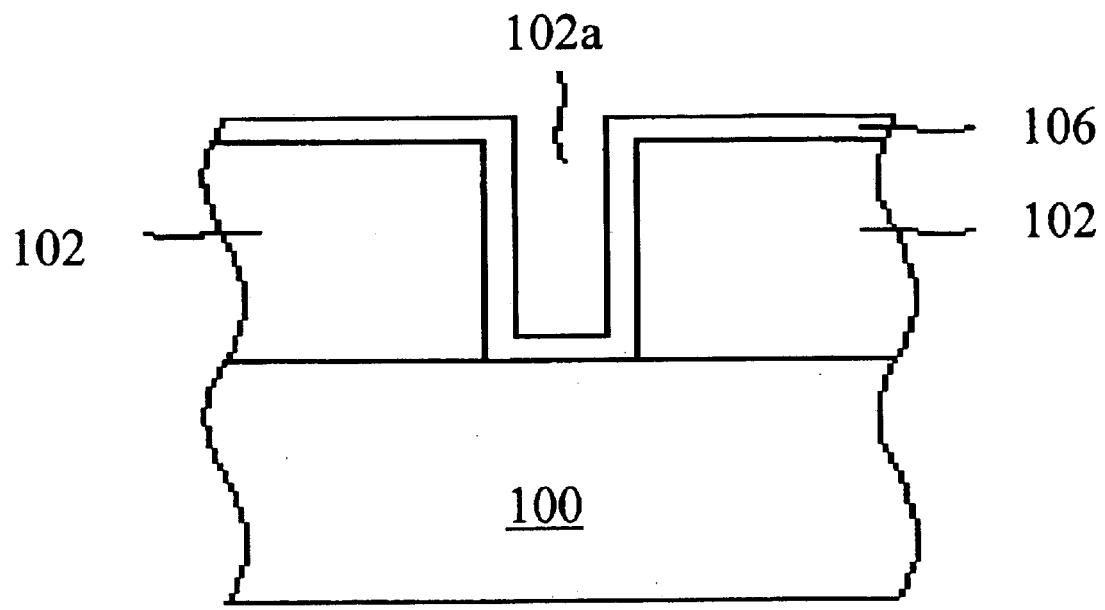
FIG. 1c is a cross-sectional view illustrating the structure of FIG. 1b after a photoresist layer has been removed and a spacer material has been deposited.
Figure 1D:
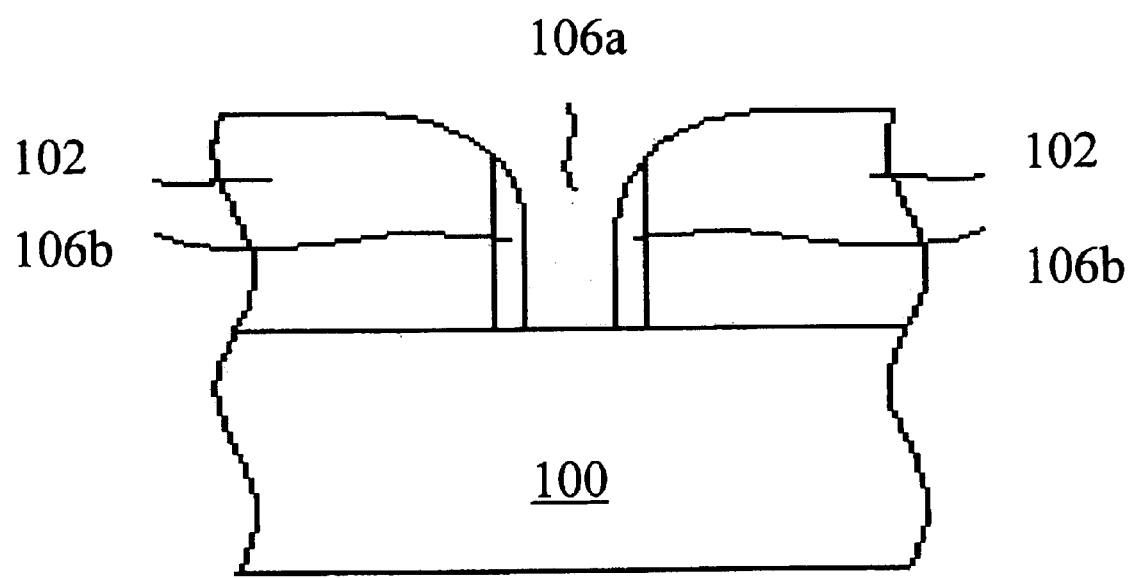
FIG. 1d is a cross-sectional view illustrating the structure of FIG. 1c after an etching process has rounded the dielectric layer around the upper portion of the contact hole while removing the spacer material outside the contact hole.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims. For example, it is understood by a person of ordinary skill practicing this invention that the invention may be used to create contact holes between a substrate and an interconnect layer or between two interconnect layers.

It is to be understood and appreciated that the process steps and structures described herein do not cover a complete process flow for the manufacture of contact holes with spacers. The present invention may be practiced in conjunction with various integrated circuit fabrication techniques that are conventionally used in the art, and only so much of the commonly practiced process steps are included herein as are necessary to provide an understanding of the present invention.

Figure 2A:
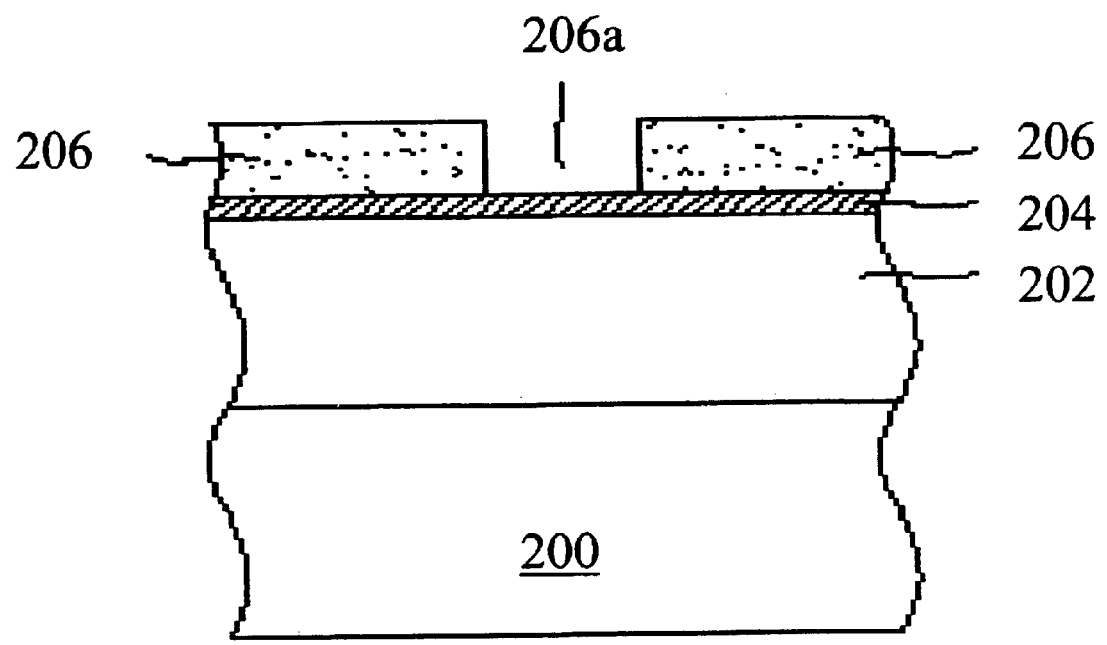
FIG. 2a is a cross-sectional view of a substrate having a first and a second dielectric layer and a patterned photoresist layer formed thereon.

With reference to FIG. 2a, a substrate 200 is depicted with a sequentially formed first dielectric layer 202, etch stop layer 204, and patterned photoresist layer 206 having an opening 206a. The substrate 200 may be a wafer, such as a silicon semiconductor wafer, suitable for the fabrication of integrated circuits (not shown) into its upper surface. The first dielectric layer 202 and etch stop layer 204 may respectively comprise, for example, a silicon oxide layer and a dielectric antireflective coating layer. In the illustrated embodiment, the antireflective coating layer comprises a silicon oxynitride layer. The first dielectric layer 202 and the etch stop layer 204 may be formed on the substrate 200 using known techniques, such as by chemical vapor deposition. The etch stop layer 204 is between about 200 and 400 Angstroms thick in the illustrated embodiment. The patterned photoresist layer 206 and opening 206a may also be formed using known photolithography techniques.

Figure 2B:
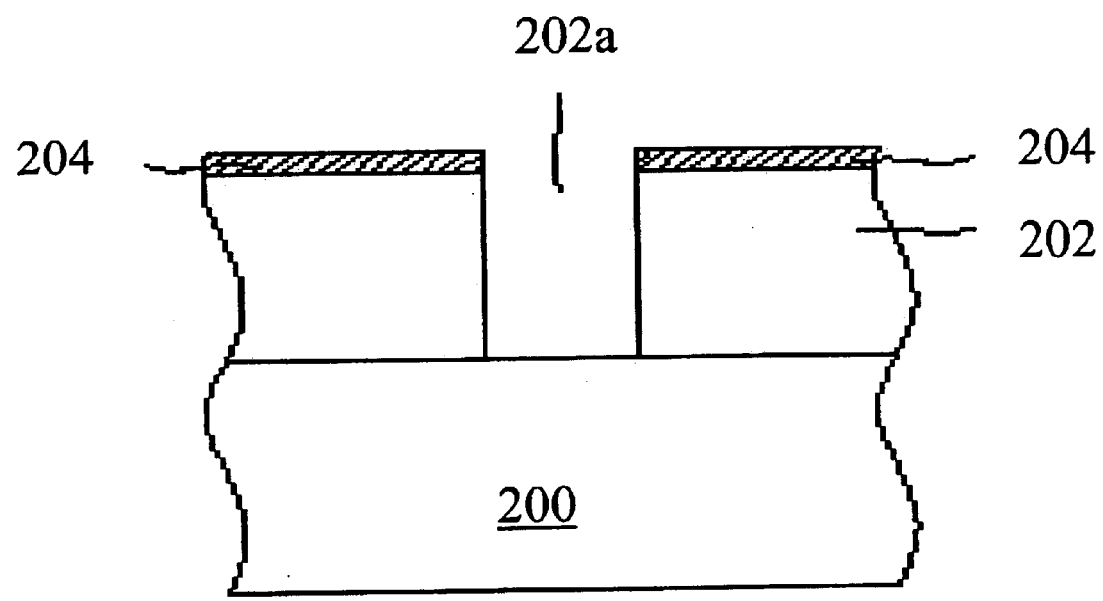
FIG. 2b is a cross-sectional view illustrating the structure of FIG. 2a after an etching process has formed a contact hole and the photoresist has been removed.

FIG. 2b illustrates the partially completed device of FIG. 2a after the etch stop layer 204 and the first dielectric layer 202 have been etched using the patterned photoresist layer 206 and opening 206a as a mask or template. The etching process preferably has a high selectivity toward the etch stop layer 204 and first dielectric layer 202 in relation to the selectivity toward the substrate 200. This can deter etching or dishing into the substrate 200 during the etching process. Alternatively, other processes may be used to cease etching before the substrate 200 is damaged. The etching process may be completed using etching equipment and processes known by those of ordinary skill in the art.

The etched area in the etch stop layer 204 and first dielectric layer 202 thus forms a contact hole 202a. This contact hole 202a exposes a surface of the substrate 200, thereby facilitating a subsequent deposition of a conductive material into the contact hole 202a to create an electrical pathway for communication between the substrate and a later manufactured interconnect layer (not shown) above the contact hole 202a.

Figure 2C:
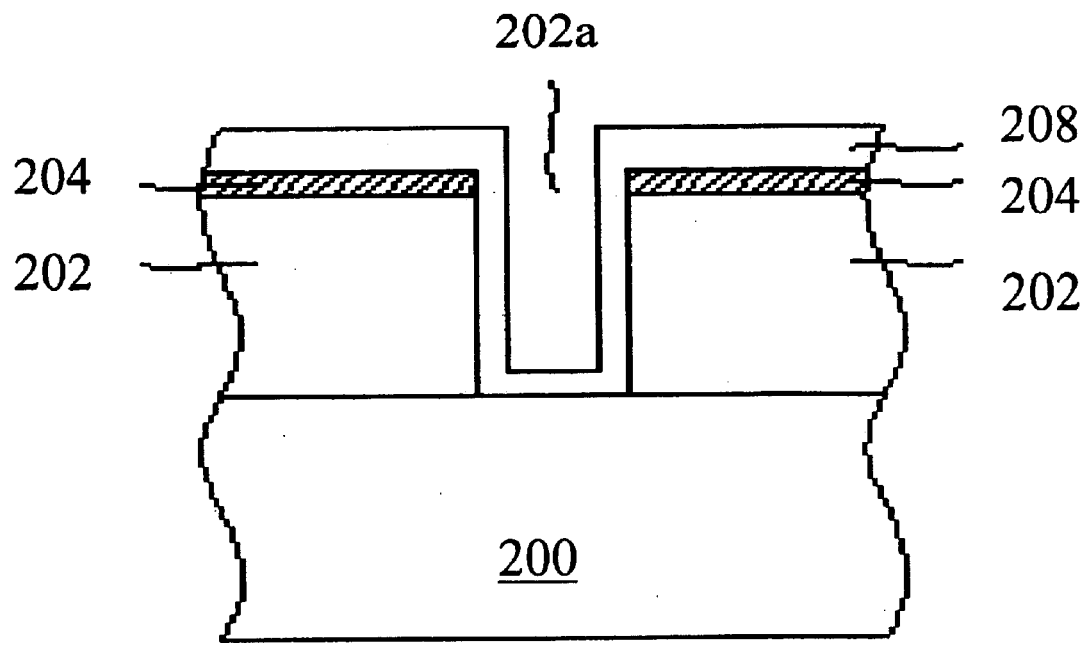
FIG. 2c is a cross-sectional view illustrating the structure of FIG. 2b after a spacer material has been deposited.

FIG. 2c illustrates the partially completed device of FIG. 2b after a conformal second dielectric layer 208 has been formed over the etch stop layer 204 and within the contact hole 202a. The conformal second dielectric layer 208 preferably has a substantially uniform thickness, despite the irregular surface conditions created by the contact hole 202a. The conformal second dielectric layer 208 may comprise, for example, a silicon oxide layer or a tetraethylorthosilicate (TEOS) oxide layer deposited using known deposition processes, such as a plasma enhanced chemical vapor deposition process.

Figure 2D:
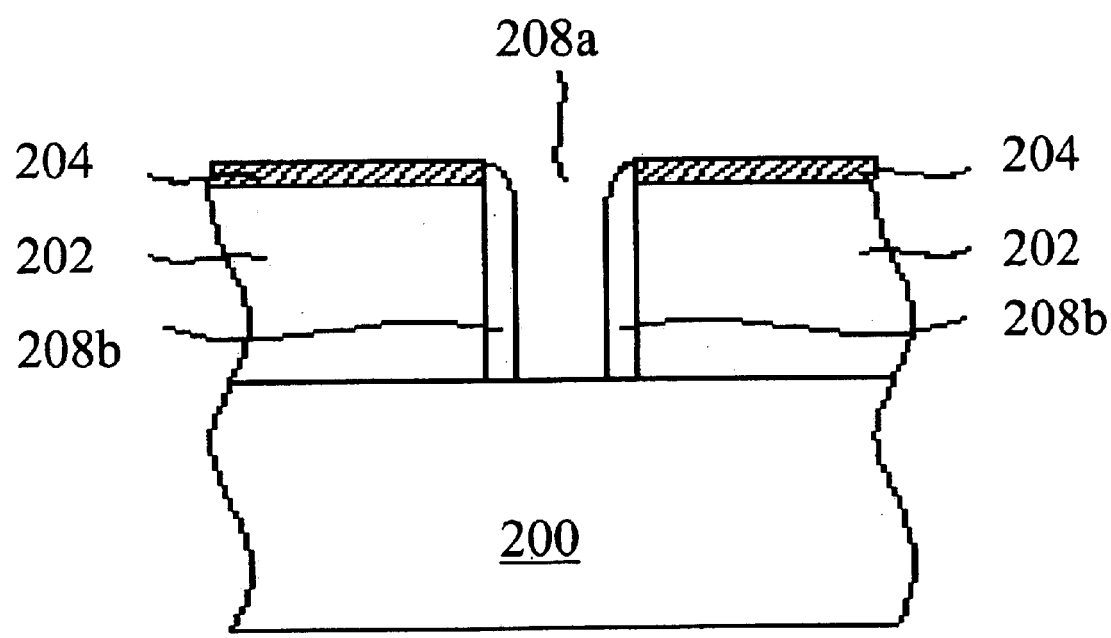
FIG. 2d is a cross-sectional view illustrating the structure of FIG. 2c after an etching process has removed the spacer material outside the contact hole leaving a contact hole with a substantially uniform CD from top to bottom.

FIG. 2d illustrates the partially completed device of FIG. 2c after an anisotropical etching process has been performed on the conformal second dielectric layer 208. The etching process removes the second conformal dielectric layer 208 from above the etch stop layer 204 while leaving portions of the second conformal dielectric layer on the sidewalls of the contact hole 202a, thus creating a spacer 208b. Thereafter, the smaller CD of the contact hole 208a is obtained from the spacer 208b.

The etching process is preferably anisotropic and should etch at a faster rate in an axis perpendicular to a plane of the substrate 200 than in an axis parallel to the plane of the substrate 200. This will deter etching of the conformal dielectric layer 208 on the sidewalls of the contact hole 208a. The etching process should be selective toward the conformal second dielectric layer 208 to efficiently remove the second dielectric layer 208 from the surface of the etch stop layer 204 and from the bottom of the contact hole 208a.

However, the etching process is preferably not selective, at least in comparison to the conformal second dielectric layer 208, to the etch stop layer 204. For instance, the conformal dielectric layer 208 is etched at 20 or more times as fast as the stop etch layer 204. In another embodiment, the etching process is additionally not selective, at least in comparison to the conformal second dielectric layer 208, to the substrate 200. Minimizing the selectivity of the etchant to the etch stop layer 204 prevents enlargement of the CD of the upper portion of the contact hole 208a, and minimizing the selectivity of the etchant to the substrate 200 can prevent dishing of the exposed surface of the substrate 200.

In a preferred embodiment, the etching process for the second conformal dielectric layer 208 is completed in an etching chamber at a pressure of about 90 mTorr for between about 20 to 30 seconds. The etching gases for this process may include a mixture of one or more of the gases oxygen ($O_2$), fluorocarbon gas ($C_4F_8$), carbon oxide (CO), and argon (Ar). In a preferred embodiment, all of the gasses are used wherein the flow rates for the oxygen, fluorocarbon gas, carbon oxide and argon are respectively about 2~6 sccm, 4 sccm is preferred; 4 to 8 sccm, 6 sccm is preferred; 50 to 100 sccm, and 120~160 sccm. The etching chamber may comprise, for example, a dual RF source plasma chamber. In addition, the power for the high frequency and for the low frequency in the dual RF source plasma chamber may be respectively about 800 W and 200 W.

In modified embodiments, other materials may be used instead of the above-described dielectrics for layers 202 and 208, and/or instead of the above-described antireflective coating layers for the etch stop layer 204, so long as a selectivity of the etchant for the dielectric layer 208 is sufficiently greater than for the etch stop layer 204. Additionally, the materials selected should be capable of facilitating formation of the contact hole 202a through the dielectric layer 202 and the etch stop layer 204. For example, it may be possible to form the etch stop layer 204 of silicon nitride (patterned by an antireflective coating and the photoresist layer 206), and to implement an etchant that exhibits a substantially greater selectivity for the second dielectric 208 over the silicon nitride so that the silicon nitride serves as an etch inhibitor and, more preferably, as an etch stop. As another example, the etch stop layer 204 may comprise polysilicon. The etchant for silicon nitride could be $CHF_3/CF_4$; the etchant for the polysilicon could be $CL_2HBR$; and the etchant of the dielectric layer could be $C_4F_8/CF_4/CHF_3$.

Figure 3:
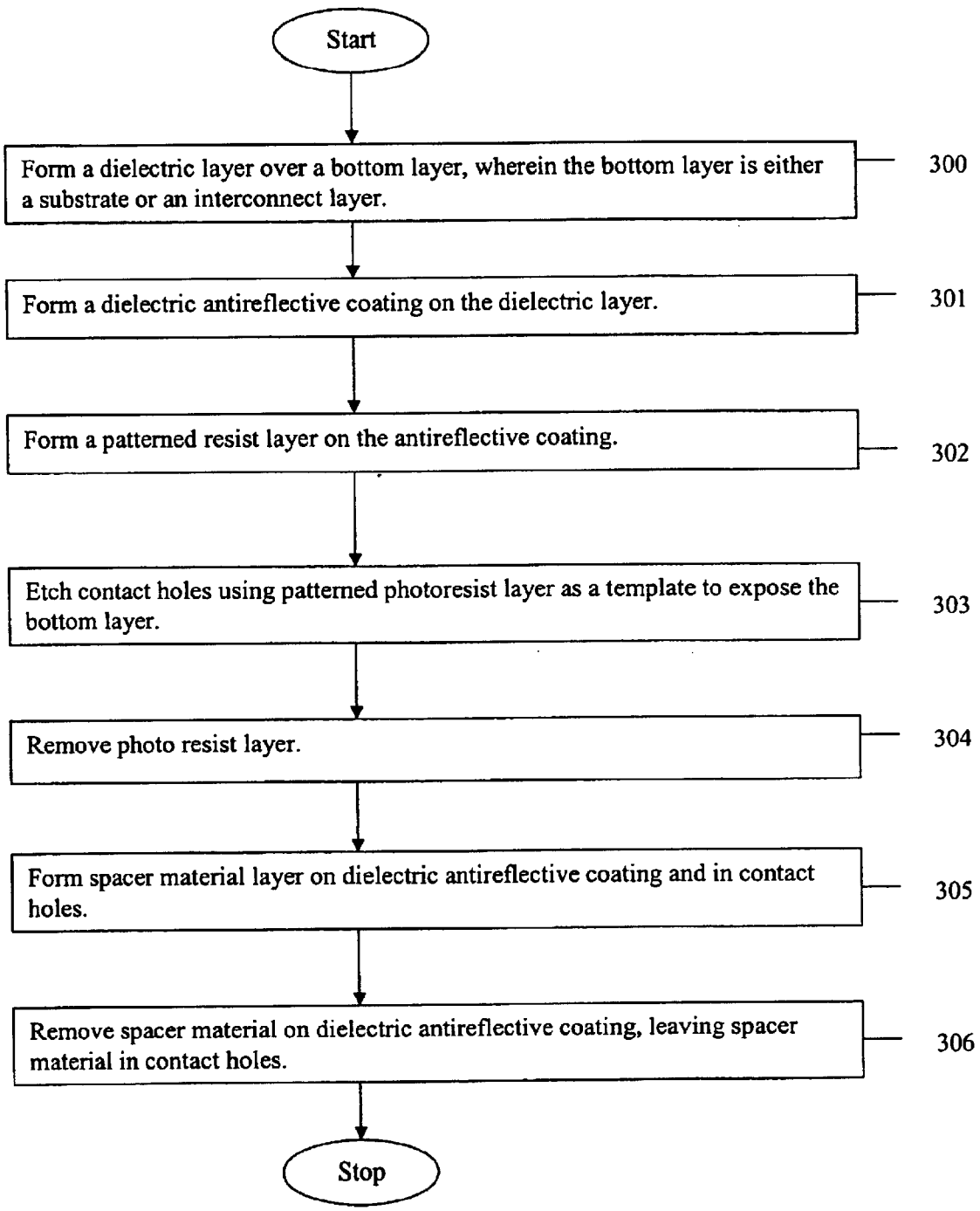
FIG. 3 is a flow chart illustrating a method of practicing the present invention.

An exemplary process for manufacturing contact holes with spacers is now discussed with reference to the flowchart shown in FIG. 3. A first dielectric layer 202 comprising, for example, silicon oxide is deposited over a substrate 200 (as shown in FIG. 2a) or over an interconnect layer (not shown) at Step 300. A dielectric antireflective coating layer 204 comprising, for example, a silicon oxynitride layer may be deposited over the first dielectric layer 202 at Step 301. A patterned photoresist layer 206 may then be formed over the etch stop layer 204 using known photoresist depositing techniques and known photolithography techniques at Step 302. A contact hole 202a may now be etched through the etch stop layer 204 and the first dielectric layer 202 using the pattern of openings in the photoresist as a template at Step 303 and as illustrated in FIG. 2b. The photoresist layer may be removed through known etching or cleaning processes at Step 304.

At Step 305, the conformal second dielectric material 208, such as silicon oxide or TEOS oxide layer deposited by a plasma enhanced chemical vapor deposition process, used for the spacer within the contact hole 202a may be formed over the etch stop layer 204 and within the contact hole 202a as illustrated in FIG. 2c. At Step 306, the conformal second dielectric material 208 over the etch stop layer 204 may then be removed, leaving the conformal second dielectric material 208 as sidewalls in the contact hole 208a as illustrated in FIG. 2d. Substantial over etching does not occur on the first dielectric layer 202, and the upper CD of the contact hole 208a is not substantially enlarged, compared to prior-art methods. Thus, a contact hole 208a having a more uniform diameter from top to bottom in comparison to prior art contact holes may be created using this process.

In view of the foregoing, it will be understood by those skilled in the art that the methods of the present invention can facilitate the formation of contact holes having spacers with a relatively uniform CD in an integrated circuit. The above-described embodiment has been provided by way of example, and the present invention is not limited to this example. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method of forming a contact hole with a spacer, comprising:
   (a) providing a substrate suitable for fabrication of integrated circuits and covered by at least a first dielectric layer, an etch stop layer and a patterned mask layer;
   (b) etching the etch stop layer and the first dielectric layer using the patterned mask layer as a mask to form a contact hole exposing the substrate;
   (c) forming a conformal second dielectric layer on the etch stop layer and in the contact hole; and
   (d) anisotropically etching the second dielectric layer to form a spacer on the sidewall of the contact hole.

2. The method of claim 1, wherein the etch stop layer comprises a dielectric antireflective coating.

3. The method of claim 1, wherein the conformal second dielectric layer is etched at a greater rate than the etch stop layer in (d).

4. The method of claim 1, wherein the conformal second dielectric layer is etched 20 or more times as fast as the etch stop layer in (d).

5. The method of claim 1, wherein the etch stop layer adjacent to the contact hole is not removed in (d).

6. The method of claim 2, wherein (d) uses an etching gas comprising oxygen fluorocarbon gas and carbon oxide.

7. The method of claim 6, wherein:
   the first and the second dielectric layers are silicon oxide layers;
   the flow rates in (d) of the oxygen, fluorocarbon gas and carbon oxide are about 140 sccm, —between about 4 and 6 sccm, and between—about 50 and 100 sccm.

8. The method of claim 6, wherein the second dielectric layer is a tetraethylorthosilicate oxide layer.

9. The method of claim 7, wherein the antireflective coating is a silicon oxynitride layer.

10. The method of claim 7, wherein:
   a pressure within an etch chamber is about 90 mTorr during (d);
   the power within an etch chamber is 200 W for a low frequency and 800 W for a high frequency during (d); and
   the etching gas further comprises argon with a flow rate of about 140 sccm acting as a carrier gas.

11. A method for creating contact holes having a uniform diameter from top to bottom, comprising:

(a) forming a dielectric layer over a bottom layer;

(b) forming an etch-stop layer over the dielectric layer;

(c) forming a patterned mask layer above the etch-stop layer;

(d) etching contact holes into the dielectric layer and the etch-stop layer using the patterned mask layer as a template to expose a surface of the bottom layer;

(e) forming a spacer layer over the etch-stop layer and into the contact holes; and (f) removing the spacer layer using the etch-stop layer as an etch stop layer, wherein portions of the spacer layer remain in the contact holes.

12. The method of claim 11, wherein the etch-stop layer comprises a dielectric antireflective coating.

13. The method of claim 11, wherein the spacer layer is etched 20 or more times as fast as the stop etch layer in (f).

14. The method of claim 11, wherein the etch-stop layer adjacent to the contact hole is not removed in (f).

15. The method of claim 12, wherein the removing of the spacer layer further comprises am anisotropically etching the spacer layer in an etch chamber using an etching gas comprising oxygen, fluorocarbon gas and carbon oxide.

16. The method of claim 15, wherein:

a flow rate of the fluorocarbon gas is between about 4 and 6 sccm; and the dielectric layer and the spacer layer comprise silicon oxide.

17. The method of claim 15, wherein the dielectric antireflective coating is a tetraethylorthosilicate oxide layer.

18. The method of claim 15, wherein the dielectric antireflective coating is a silicon oxynitride layer.

19. The method of claim 15, wherein:

a pressure within the etch chamber is about 90 mTorr during (f);

the power within the etch chamber is 200 W for a low frequency and 800 W for a high frequency during (f); and the etching process during (f) is performed for between about 20 and 30 seconds.

20. The method of claim 15, wherein:

the etching gas further comprises argon with a flow rate of about 140 sccm acting as a carrier gas;

the flow rate of the oxygen is about 140 sccm;

the flow rate of the carbon oxide is between about 50 and 100 sccm; and the thickness of the antireflective coating is between about 200 and 400 angstroms.

21. A method of forming a contact hole with a spacer, comprising:

(a) providing a substrate suitable for fabrication of integrated circuits and covered by a first dielectric layer and an etch stop layer;

(b) etching the etch stop layer and the first dielectric layer to form a contact hole exposing the substrate;

(c) forming a conformal second dielectric layer on the etch stop layer and in the contact hole; and (d) etching the second dielectric layer to form a spacer on the sidewall of the contact hole, wherein etching of the second dielectric layer occurs at a faster rate than etching of the etch stop layer.

22. The method of claim 21, wherein the second dielectric layer is etched 20 or more times as fast as the etch stop layer in (d).

23. The method of claim 21, wherein the etch stop layer adjacent to the contact hole is not removed in (d).

24. The method of claim 23, wherein the etch stop layer comprises a dielectric antireflective coating.

25. A method of forming a contact hole with a spacer, comprising:

(a) providing a substrate covered by at least a first dielectric layer, an etch top layer comprising a dielectric antireflective coating, and a patterned mask layer;

(b) etching the etch stop layer and the first dielectric layer using the patterned mask layer as a mask to form a contact hole exposing the substrate;

(c) forming a conformal second dielectric layer on the etch stop layer and in the contact hole; and (d) anisotropically etching the second dielectric layer using an etching gas comprising oxygen, fluorocarbon gas and carbon oxide to form a spacer on the sidewall of the contact hole.

26. The method of claim 25, wherein:

the first and the second dielectric layers are silicon oxide layers;

the flow rates in (d) of the oxygen, fluorocarbon gas and carbon oxide are about 140 sccm between about 4 and 6 sccm, and between about 50 and 100 sccm.

27. The method of claim 25, wherein the second dielectric layer is a tetraethylorthosilicate oxide layer.

28. The method of claim 26, wherein the antireflective coating is a silicon oxynitride layer.

29. The method of claim 26, wherein:

a pressure within an etch chamber is about 90 mTorr during (d);

the power within an etch chamber is 200 W for a low frequency and 800 W for a high frequency during (d); and the etching gas further comprises argon with a flow rate of about 140 sccm acting as a carrier gas.

30. A method for creating contact holes having a uniform diameter from top to bottom, comprising:

(a) forming a dielectric layer over a bottom layer;

(b) forming an etch stop layer comprising a dielectric antireflective coating over the dielectric layer;

(c) forming a patterned mask layer above the etch stop layer;

(d) etching contact holes into the dielectric layer and the etch stop layer using the patterned mask layer as a template to expose a surface of the bottom layer;

(e) forming a spacer layer over the etch stop layer and into the contact holes; and (f) removing the spacer layer from over the etch stop layer, wherein the removing comprises anisotropically etching the spacer layer in an etch chamber using an etching gas comprising oxygen, fluorocarbon gas and carbon oxide and wherein portions of the spacer layer remain in the contact holes.

31. The method of claim 30, wherein:

a flow rate of the fluorocarbon gas is between about 4 and 6 sccm; and the dielectric layer and the spacer layer comprise silicon oxide.

32. The method of claim 30, wherein the dielectric antireflective coating is a tetraethylorthosilicate oxide layer.

33. The method of claim 30, wherein the dielectric antireflective coating is a silicon oxynitride layer.

34. The method of claim 30, wherein:

a pressure within the etch chamber is about 90 mTorr during (f);

the power within the etch chamber is 200 W for a low frequency and 800 W for a high frequency during (f); and the etching process during (f) is performed for between about 20 and 30 seconds.

35. The method of claim 30, wherein:

the etching gas further comprises argon with a flow rate of about 140 sccm acting as a carrier gas;

the flow rate of the oxygen is about 140 sccm;

the flow rate of the carbon oxide is between about 50 and 100 sccm; and the thickness of the antireflective coating is between about 200 and 400 angstroms.

* * * * *